(12) United States Patent
Ham et al.

(10) Patent No.: US 10,047,182 B2
(45) Date of Patent: Aug. 14, 2018

(54) METHOD OF FORMING FINE PATTERNS USING BLOCK COPOLYMER

(71) Applicants: SK Innovation Co., Ltd., Seoul (KR); Korea Advanced Institute of Science and Technology, Daejeon (KR)

(72) Inventors: Jin Su Ham, Daejeon (KR); Yeon Sik Jung, Daejeon (KR); Sun Young Kim, Daejeon (KR); Yoon Hyung Hur, Daejeon (KR); Kwang Kuk Lee, Daejeon (KR); Seung Won Song, Daejeon (KR)

(73) Assignees: SK Innovation Co., Ltd., Seoul (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 15/712,698

(22) Filed: Sep. 22, 2017

(65) Prior Publication Data

US 2018/0086869 A1    Mar. 29, 2018

(30) Foreign Application Priority Data

Sep. 23, 2016  (KR) .................. 10-2016-0121959

(51) Int. Cl.
| | |
|---|---|
| *C08F 220/18* | (2006.01) |
| *C08F 212/08* | (2006.01) |
| *C08F 114/18* | (2006.01) |
| *C08F 293/00* | (2006.01) |
| *H01L 21/311* | (2006.01) |
| *C08F 212/14* | (2006.01) |

(52) U.S. Cl.
CPC ........ *C08F 220/18* (2013.01); *C08F 114/185* (2013.01); *C08F 212/08* (2013.01); *C08F 293/005* (2013.01); *H01L 21/31138* (2013.01)

(58) Field of Classification Search
CPC ......... H01L 21/31105; H01L 21/31138; C08F 293/005; C08F 212/14; C08F 214/182; C08F 220/18; C08F 293/00
USPC ....................................................... 525/276
See application file for complete search history.

(56) References Cited

U.S. PATENT DOCUMENTS

| | | | |
|---|---|---|---|
| 2013/0273330 A1* | 10/2013 | Wang ................... | B81C 1/0038 428/172 |
| 2015/0108087 A1 | 4/2015 | Somervell et al. | |
| 2015/0197594 A1* | 7/2015 | Xu ....................... | C09D 153/00 428/195.1 |
| 2017/0313869 A1* | 11/2017 | Lee ....................... | C08L 53/005 |

FOREIGN PATENT DOCUMENTS

KR    1020160073408 A    6/2016

OTHER PUBLICATIONS

Bucholz, et al., "Phase Behavior of Near-Monodisperse Semifluorinated Diblock Copolymers by Atom Transfer Radical Polymerization," Macromolecules 2006, 39, 6075-6080.*
Leibler; "Theory of Microphase Separation in Block Copolymers"; Macromolecules; 1980; pp. 1602-1617; vol. 13.
Sakamoto et al.; "Order-Disorder Transition of Low Molecular Weight Polystyrene-block-Polyisoprene. 1. SAXS Analysis of Two Characteristic Temperatures"; Macromolecules; 1995; pp. 6825-6834; vol. 28.
Zhao et al.; "SAXS Analysis of the Order-Disorder Transition and the Interaction Parameter of Polystyrene-block-poly(methyl methacrylate)"; Macromolecules; 2008; pp. 9948-9951; vol. 41.

* cited by examiner

*Primary Examiner* — Fred M Teskin
(74) *Attorney, Agent, or Firm* — The Webb Law Firm

(57) ABSTRACT

Provided is a method of forming fine patterns capable of minimizing LER and LWR to form high quality nanopatterns, by using a block copolymer having excellent etching selectivity. Provided is a block copolymer comprising a first block having a repeating unit represented by the following Chemical Formula 1, and a second block having a repeating unit represented by the following Chemical Formula 2:

[Chemical Formula 1]

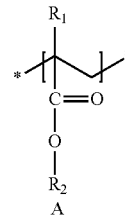

[Chemical Formula 2]

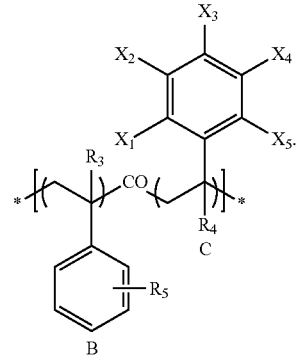

8 Claims, 2 Drawing Sheets

METHOD OF FORMING FINE PATTERNS USING BLOCK COPOLYMER

CROSS-REFERENCE TO RELATED APPLICATION

This application claims priority to Korean Patent Application No. 10-2016-0121959 filed Sep. 23, 2016, the disclosure of which is hereby incorporated in its entirety by reference.

TECHNICAL FIELD

The following disclosure relates to a method of forming fine patterns, and more particularly, to a method of forming fine patterns, capable of forming high quality nanopatterns by minimizing LER and LWR by using a block copolymer having excellent etching selectivity.

BACKGROUND

As miniaturization and compactness for an element having high performance are constantly demanded, a technique for producing high density nanopatterns by further reducing a pitch size of patterns, for example, a line width of patterns (critical dimension, CD) and spacing between patterns for implementing more patterns in a limited area is required.

As one method for forming nanopatterns, a photolithography technique in a top-down manner may be exemplified. However, the photolithography technique is limited in improving resolution due to the wavelength of a light source, the resolution limitation of an optical system and the like.

As one of the efforts for overcoming resolution limitation in the photolithography technique and developing next-generation micromachining technology, a directed self-assembly (DSA) technique in a bottom-up manner using the self-assembly of molecules is receiving attention (Korean Patent Laid-Open Publication No. 10-2016-0073408).

The DSA technique has merits of being relatively simple, capable of forming high density patterns as compared with a conventional photolithography technique, and capable of forming a periodically arranged structure such as a sphere, a cylinder or a lamella shape by phase separation of a block copolymer.

However, the block copolymers suggested so far have rather low etching selectivity between each block to destroy patterns, or to have difficulty in reducing the line width of patterns to below a certain level, and have rather a lot of defects in LER (line edge roughness), LWR (line width roughness) and the like to degrade the quality of a semiconductor device.

Accordingly, there is currently a need to develop a method of forming fine patterns capable of minimizing LER and LWR to form high quality nanopatterns.

RELATED ART DOCUMENT

Patent Document

Korean Patent Laid-Open Publication No. 10-2016-0073408 (Jun. 24, 2016)

SUMMARY

An embodiment of the present invention is directed to a method of forming fine patterns, capable of minimizing LER and LWR to form high quality nanopatterns.

In one general aspect, a method of forming fine patterns includes an aligning step of aligning a block copolymer coated on a substrate to be patterned; and a removing step of selectively removing any one unit block of the patterned block copolymer, wherein the block copolymer includes a first block having a repeating unit represented by the following Chemical Formula 1, and a second block having a repeating unit represented by the following Chemical Formula 2:

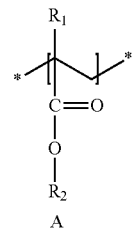

[Chemical Formula 1]

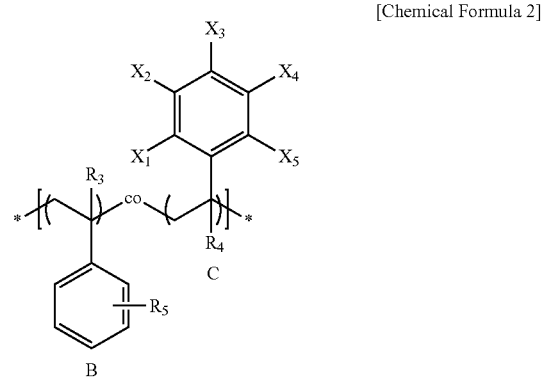

[Chemical Formula 2]

wherein $R_1$ to $R_4$ are independently selected from the group consisting of —H, an alkyl group having 1 to 10 carbon atoms, an alkenyl group having 2 to 10 carbon atoms, an alkynyl group having 2 to 10 carbon atoms, a halogen group, a cyano group, an alkoxy group having 1 to 10 carbon atoms, an alkylthio group having 1 to 10 carbon atoms, an alkylcarbonyl group having 1 to carbon atoms, and an alkenylcarbonyl group having 2 to 10 carbon atoms;

$R_5$ is selected from the group consisting of —H an alkyl group having 1 to 10 carbon atoms, a cycloalkyl group having 3 to 10 carbon atoms, an alkenyl group having 2 to 10 carbon atoms, a cycloalkenyl group having 3 to 10 carbon atoms, an alkynyl group having 2 to 10 carbon atoms, a heterocycloalkyl group having 2 to 10 carbon atoms containing any one or two or more heteroatoms selected from O, N and S, an aryl group having 6 to 20 carbon atoms, a heteroaryl group having 4 to 20 carbon atoms containing any one or two or more heteroatoms selected from O, N and S, a halogen group, a cyano group, an alkoxy group having 1 to 10 carbon atoms, a cycloalkoxy group having 3 to 10 carbon atoms, an aryloxy group having 6 to 20 carbon atoms, an alkylthio group having 1 to 10 carbon atoms, a cycloalkylthio group having 3 to 10 carbon atoms, an arylthio group having 6 to carbon atoms, an alkylcarbonyl group having 1 to 10 carbon atoms, an alkenylcarbonyl group having 2 to 10 carbon atoms, an arylcarbonyl group having 6 to 20 carbon atoms, a cycloalkylcarbonyl group having 3 to 10 carbon atoms, and a cycloalkenylcarbonyl group having 3 to 10 carbon atoms;

$X_1$ to $X_5$ are independently selected from the group consisting of —H, —F, an alkyl group having 1 to 10 carbon atoms substituted with at least one F, a cycloalkyl group having 3 to carbon atoms substituted with at least one F, and an aryl group having 6 to 20 carbon atoms substituted with at least one F, with a proviso that not all of them are —H.

In the block copolymer, when mole fractions of repeating units A, B and C in the block copolymer represented by the above Chemical Formulae 1 and 2 are l, n and m, respectively, l is 0.2 to 0.9, n is 0 to 0.6, m is 0.01 to 0.7, and l+n+m=1.

Other features and aspects will be apparent from the following detailed description, the drawings, and the claims.

DETAILED DESCRIPTION OF EMBODIMENTS

Figure 1:
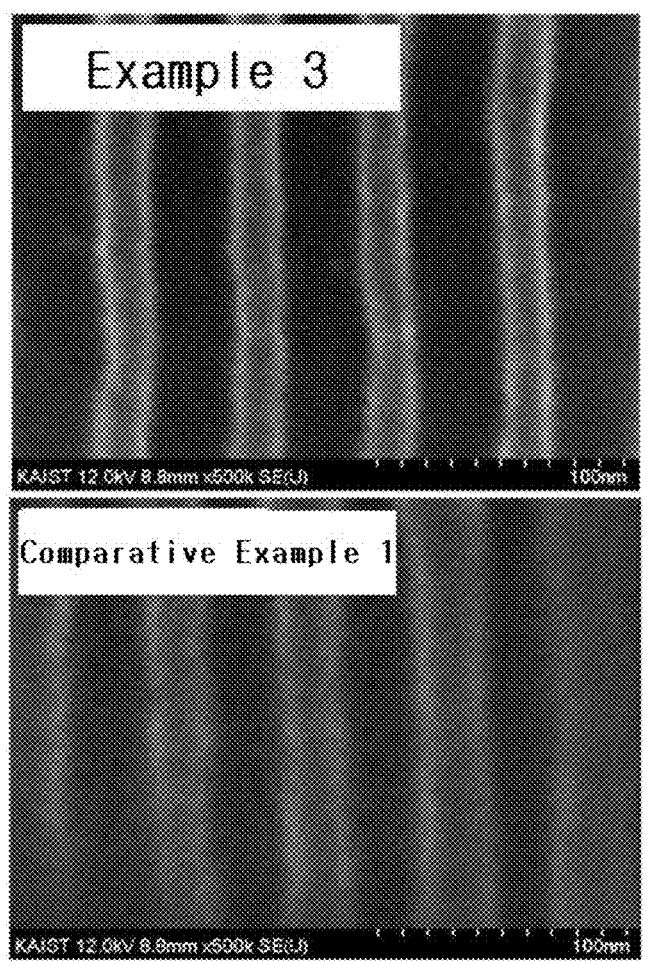
FIG. 1 represents etched nanopatterns according to Example and Comparative Example 1, showing that the line width of Example 3 is narrower than that of Comparative Example 1.

The advantages, features and aspects of the present invention will become apparent from the following description of the embodiments with reference to the accompanying drawings, which is set forth hereinafter. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, the method of forming fine patterns according to the present invention will be described in detail with reference to the accompanying drawings. The drawings to be provided below are provided by way of example so that the idea of the present invention can be sufficiently transferred to a person skilled in the art to which the present invention pertains. Therefore, the present invention is not limited to the drawings provided below but may be modified in many different forms. In addition, the drawings suggested below will be exaggerated in order to clear the spirit and scope of the present invention. In addition, like reference numerals denote like elements throughout the specification.

Technical terms and scientific terms used herein have the general meaning understood by a person skilled in the art to which the present invention pertains unless otherwise defined, and a description for the known function and configuration obscuring the present invention will be omitted in the following description and the accompanying drawings.

An 'alkyl group' and an 'alkoxy group' described herein refer to monovalent organic radicals including both straight chain and branched chain forms. An 'aryl group' refers to a monovalent organic radical derived from aromatic hydrocarbon by removal of one hydrogen, including a monocyclic or fused ring system containing suitably 4 to 7, preferably 5 or 6 ring atoms in each ring, and also including even a form in which a plurality of aryls is linked by a single bond. A specific example of the aryl group includes an aromatic group such as phenyl, naphthyl, indenyl, fluorenyl, phenanthrenyl, anthracenyl, triphenylenyl, pyrenyl, chrysenyl and naphthacenyl groups. An 'arylene group' is a divalent organic radical derived from aromatic hydrocarbon by removing two hydrogens. A 'heteroaryl group' refers to a monovalent aryl group containing any one or more heteroatoms selected from N, O and S as an aromatic ring skeletal atom, and carbons as a remaining aromatic ring skeletal atom, and is 5 or 6-membered monocyclic heteroaryl, or a polycyclic heteroaryl condensed with at least one benzene ring. In addition, heteroaryl herein also includes a form to which at least one heteroaryl is linked by a single bond. As an example, monocyclic heteroaryl such as furyl, thiophenyl, pyrrolyl, pyranyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl and pyridazinyl, and polycyclic heteroaryl such as benzofuranyl, benzothiophenyl, isobenzofuranyl, benzoimidazolyl, benzothiazolyl, benzoisothiazolyl, benzoisoxazolyl, benzoxazolyl, isoindolyl, indolyl, indazolyl, benzothiadiazolyl, quinolyl, isoquinolyl, cinnolinyl, quinazolinyl, quinolizinyl, quinoxalinyl, carbazolyl, phenanthridinyl and benzodioxolyl is included. A 'heteroarylene group' is a divalent organic radical derived from heteroaromatic hydrocarbon by removing two hydrogens.

Previously, as a block copolymer for a DSA technique, a polymethylmethacrylate-b-polystyrene block copolymer (PMMA-b-PS) was often used. PMMA-b-PS has an excellent pattern aspect ratio, an excellent vertical orientation property, and excellent etching selectivity in wet development.

However, when wet-etching PMMA-b-PS, there is no problem in a spherical or cylindrical pattern formation, but in the case of lamella patterns, PS patterns are destroyed by capillary force to greatly increase roughness, which makes an ideal pattern transfer impossible.

Thus, as a method for forming lamella patterns, dry development using plasma and the like has been used, however, it is still difficult to reduce the line width to below a certain level, and there are rather a lot of defects in LER (line edge roughness), LWR (line width roughness) and the like to degrade the quality of a semiconductor device.

Thus, the present inventors performed research for a long time for providing a method of forming fine patterns capable of reducing a line width to improve pattern density, while minimizing LER and LWR to improve the quality of a semiconductor device, and in this process, found out that when a block copolymer having a certain structure has a middle-$\chi$ value, desired line width, LER and LWR may be achieved, and as a result of repeated efforts for obtaining the middle-$\chi$ value of the block copolymer, also found out that when using a styrene group to which an F group is introduced, in an appropriate amount, a block copolymer having the middle-$\chi$ value may be prepared, thereby completing the present invention.

Specifically, the method of forming fine patterns according to the present invention includes an aligning step of aligning a block copolymer coated on a substrate to be patterned; and a removing step of selectively removing any one unit block of the patterned block copolymer, wherein the block copolymer may include a first block having a repeating unit represented by the following Chemical Formula 1, and a second block having a repeating unit represented by the following Chemical Formula 2:

[Chemical Formula 1]

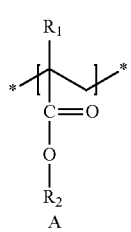

[Chemical Formula 2]

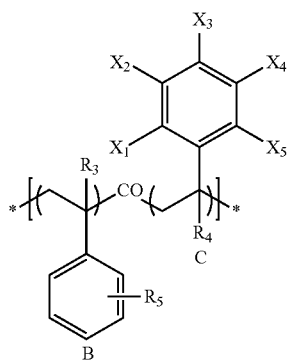

wherein $R_1$ to $R_4$ are independently selected from the group consisting of —H, an alkyl group having 1 to 10 carbon atoms, an alkenyl group having 2 to 10 carbon atoms, an alkynyl group having 2 to 10 carbon atoms, a halogen group, a cyano group, an alkoxy group having 1 to 10 carbon atoms, an alkylthio group having 1 to 10 carbon atoms, an alkylcarbonyl group having 1 to carbon atoms, and an alkenylcarbonyl group having 2 to 10 carbon atoms;

$R_5$ is selected from the group consisting of —H an alkyl group having 1 to 10 carbon atoms, a cycloalkyl group having 3 to 10 carbon atoms, an alkenyl group having 2 to 10 carbon atoms, a cycloalkenyl group having 3 to 10 carbon atoms, an alkynyl group having 2 to 10 carbon atoms, a heterocycloalkyl group having 2 to 10 carbon atoms containing any one or two or more heteroatoms selected from O, N and S, an aryl group having 6 to 20 carbon atoms, a heteroaryl group having 4 to 20 carbon atoms containing any one or two or more heteroatoms selected from O, N and S, a halogen group, a cyano group, an alkoxy group having 1 to 10 carbon atoms, a cycloalkoxy group having 3 to 10 carbon atoms, an aryloxy group having 6 to 20 carbon atoms, an alkylthio group having 1 to 10 carbon atoms, a cycloalkylthio group having 3 to 10 carbon atoms, an arylthio group having 6 to carbon atoms, an alkylcarbonyl group having 1 to 10 carbon atoms, an alkenylcarbonyl group having 2 to 10 carbon atoms, an arylcarbonyl group having 6 to 20 carbon atoms, a cycloalkylcarbonyl group having 3 to 10 carbon atoms, and a cycloalkenylcarbonyl group having 3 to 10 carbon atoms;

$X_1$ to $X_5$ are independently selected from the group consisting of —H, —F, an alkyl group having 1 to 10 carbon atoms substituted with at least one F, a cycloalkyl group having 3 to carbon atoms substituted with at least one F, and an aryl group having 6 to 20 carbon atoms substituted with at least one F, with a proviso that not all of them are —H.

In the block copolymer, when mole fractions of repeating units A, B and C in the block copolymer represented by the above Chemical Formulae 1 and 2 are l, n and m, respectively, l is 0.2 to 0.9, n is 0 to 0.6, m is 0.01 to 0.7, and l+n+m=1. Here, in Chemical Formula 2, -co- refers to a copolymer.

More specifically, the second block having the repeating unit represented by Chemical Formula 2 may be a random copolymer in which repeating units represented by B and C are randomly distributed, or an alternating copolymer in which repeating units are bonded in alternating manner, and preferably it may be a random copolymer. As such, the block copolymer including the first block and the second block may have a very good vertical orientation property to form vertically oriented lamella patterns by a self-assembly process in a very short time, and to form almost perfectly aligned nanopatterns even on a large area substrate. In addition, the etching selectivity between two blocks is excellent, thereby decreasing LER and LWR in development. Here, the self-assembling process may refer to the aligning step in the present invention.

More preferably, in the block copolymer according to an exemplary embodiment of the present invention, $R_1$ to $R_4$ may be independently selected from the group consisting of —H, an alkyl group having 1 to 10 carbon atoms, an alkenyl group having 2 to carbon atoms, and an alkynyl group having 2 to 10 carbon atoms.

In the block copolymer according to an exemplary embodiment of the present invention, $R_5$ may be selected from the group consisting of —H, an alkyl group having 1 to 10 carbon atoms, a cycloalkyl group having 3 to 10 carbon atoms, an alkenyl group having 2 to 10 carbon atoms, a cycloalkenyl group having 3 to 10 carbon atoms, an alkynyl group having 2 to 10 carbon atoms, a heterocycloalkyl group having 2 to 10 carbon atoms containing any one or two or more heteroatoms selected from O, N and S, an aryl group having 6 to 20 carbon atoms, a heteroaryl group having 4 to 20 carbon atoms containing any one or two or more heteroatoms selected from O, N and S, a halogen group, a cyano group, an alkoxy group having 1 to 10 carbon atoms, a cycloalkoxy group having 3 to 10 carbon atoms, an aryloxy group having 6 to 20 carbon atoms, an alkylthio group having 1 to 10 carbon atoms, a cycloalkylthio group having 3 to 10 carbon atoms, an arylthio group having 6 to 20 carbon atoms, an alkylcarbonyl group having 1 to 10 carbon atoms, an alkenylcarbonyl group having 2 to 10 carbon atoms, an arylcarbonyl group having 6 to carbon atoms, a cycloalkylcarbonyl group having 3 to 10 carbon atoms, and a cycloalkenylcarbonyl group having 3 to 10 carbon atoms.

In the block copolymer according to an exemplary embodiment of the present invention, $X_1$ to $X_5$ are independently selected from the group consisting of —H, —F, an alkyl group having 1 to carbon atoms substituted with at least one F, a cycloalkyl group having 3 to 10 carbon atoms substituted with at least one F, and an aryl group having 6 to 20 carbon atoms substituted with at least one F, with a proviso that all of them are not —H.

In addition, in the block copolymer according to an exemplary embodiment of the present invention, when the mole fractions of repeating units A, B and C in the block copolymer represented by the above Chemical Formulae 1 and 2 are 1, n and m, respectively, l may be 0.35 to 0.8, n may be 0.1 to 0.5, m may be 0.1 to 0.5, and l+n+m may be 1.

By including the first and second blocks satisfying the above, the block copolymer according to an exemplary embodiment of the present invention may secure lamella patterns having excellent quality. However, in order to effectively form the lamella patterns and secure high quality patterns, as described below, it is preferred to adjust the mole fraction of each repeating unit differently depending on the number of introduced fluorine groups.

Preferably, in the block copolymer according to an exemplary embodiment of the present invention, the second block may satisfy the following Chemical Formula 3:

[Chemical Formula 3]

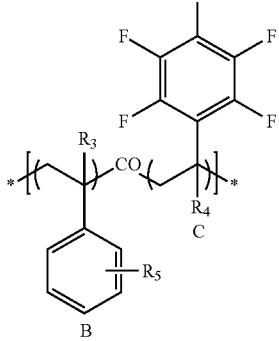

wherein $R_3$ to $R_5$, n and m are as defined in Chemical Formula 2.

More preferably, in Chemical Formula 3, $R_3$ and $R_4$ may be independently selected from the group consisting of —H and an alkyl group having 1 to 10 carbon atoms; $R_5$ may be selected from the group consisting of —H, an alkyl group having 1 to 10 carbon atoms, a cycloalkyl group having 3 to 10 carbon atoms, an alkoxy group having 1 to 10 carbon atoms and an aryloxy group having 6 to 20 carbon atoms; and n may be 0.1 to 0.5, m may be 0.1 to 0.5, and l+n+m may be 1. Here, l may be as defined in Chemical Formula 1, more preferably 0.35 to 0.8.

As such, by introducing the repeating unit C having a pentafluorostyrene group into the second block, the etching rate may be significantly lowered as compared with the first block, and thus, LER and LWR of the patterns may be greatly decreased.

In addition, in an exemplary embodiment of the present invention, the mole fraction of each unit block, specifically the mole fraction of the repeating unit B may be adjusted differently depending on the number of substituents containing a fluorine group substituted in the repeating unit C.

Specifically, when $X_1$ to $X_5$ may be all substituted by a substituent containing a fluorine group, n may be 0.01 to 0.6, and when $X_1$ to $X_5$ have at least one —H, n may be 0 to 0.6.

That is, in the block copolymer according to an exemplary embodiment of the present invention, $X_1$ to $X_5$ may be independently selected from the group consisting of —H, —F, an alkyl group having 1 to 10 carbon atoms substituted with at least one F, a cycloalkyl group having 3 to 10 carbon atoms substituted with at least one F, and an aryl group having 6 to 20 carbon atoms substituted with at least one F, with a proviso that all of them are not —H; and when l, n and m are mole fractions of the repeating units A, B and C, respectively, l may be 0.2 to 0.9, n may be 0.01 to 0.6, m may be 0.01 to 0.7, and l+n+m may be 1.

In particular, when a pentafluorostyrene group is contained as the repeating unit C, the lamella patterns may be more effectively and stably formed by satisfying that l is 0.4 to 0.6, n is 0.2 to 0.4, and m is 0.1 to 0.3.

Otherwise, in the block copolymer according to another exemplary embodiment of the present invention, $X_1$ to $X_5$ may be independently selected from the group consisting of —H, —F, an alkyl group having 1 to 10 carbon atoms substituted with at least one F, a cycloalkyl group having 3 to 10 carbon atoms substituted with at least one F, and an aryl group having 6 to 20 carbon atoms substituted with at least one F, with a proviso that at least one, but not more than four of $X_1$ to $X_5$ necessarily have a —H group; and when l, n and m are the mole fractions of the repeating units A, B and C in the block copolymer, respectively, l may be 0.2 to 0.9, n may be 0 to 0.6, m may be 0.01 to 0.7, and l+n+m may be 1.

In particular, when a fluorostyrene group containing one fluorine group is contained as the repeating unit C, the lamella patterns may be more effectively and stably formed by satisfying that l is 0.4 to 0.6, n is 0 to 0.1, and m is 0.4 to 0.6.

Meanwhile, it is preferred to also use the first block by selecting the kind thereof, and specifically it is preferred to use the one formed from an alkylmethacrylate-based compound as the first block for improving the etching selectivity with respect to the second block. More specifically, for example, the first block may be polymethylmethacrylate (PMMA), polyethylmethacrylate (PEMA), polypropylmethacrylate (PPMA), poly-t-butylmethacrylate (PMBA), or the like. Particularly preferably, by using PMMA as the first block, the etching selectivity with respect to the second block may be significantly improved. However, it is not preferred that the first block contains a ring structure such as an aromatic group or cycloaliphatic group, since the etching property may be deteriorated by the ring structure to decrease the etching selectivity with respect to the second block, and it is difficult to adjust the χ value to an appropriate range, making the formation of the lamella patterns difficult.

Particularly preferably, PMMA is used as the first block, and a compound having a repeating unit satisfying Chemical Formula 3 may be used as the second block. Accordingly, a block copolymer having a maximized etching property may be provided, which greatly reduces the line width to significantly improve pattern density, and to secure high quality patterns. Specifically, the block copolymer according to an exemplary embodiment of the present invention may form patterns having LER of 3.3 nm or less, and LWR of 4.5 nm or less. Here, the lower limit of LER and LWR may be the lowest numerical value as substantially possible, and specifically for example, 0.1 nm or more.

As described above, periodically vertically aligned lamella patterns may be formed using the block copolymer including the first and second blocks, and in order to improve the efficiency, it is preferred to adjust a χ (chi) value of the block copolymer to an appropriate range, wherein the χ value is a Flory-Huggins interaction parameter, which is the digitized value of interaction between the first and second blocks, and was calculated according to Leibler's mean-field theory by small-angle X-ray scattering (SAXS) measurement.

Specifically, together with the result obtained from the SAXS measurement, the χ value of the block copolymer may be derived by the theoretical formula of the Leibler's mean-field theory, and the derivation process is as follows:

$$I(q)=K[S(q)/W(q)-2\chi]^{-1}$$

$$S(q)=<S_{x,x}(q)>_v+2<S_{x,y}(q)>_v+<S_{y,y}(q)>_v$$

$$W(q)=<S_{x,x}(q)>_v*<S_{y,y}(q)>_v-<S_{x,y}(q)>_v^2$$

$$<S_{x,x}(q)>_v=r_{c,n}f_x^2{}_m g_x^{(2)}{}_m(q)$$

$$<S_{x,y}(q)>_v=r_{c,n}f_x f_y g_x^{(1)}{}_m(q)g_y^{(1)}{}_m(q)$$

$$r_{c,n}=(v_x N_{x,n}+v_y N_{y,n})/(v_x*v_y)^{1/2}$$

$$g_x^{(1)}{}_m(q)=1/X_{x,n}\{1-[x_{x,n}(\lambda_x-1)+1]^{-(\lambda x-1)-1}\}$$

$$g_x^{(2)}{}_m(q)=1/X_{x,n}^2\{-1+[x_{x,n}(\lambda_x-1)+1]^{-(\lambda x-1)-1}\}$$

$$x_{x,n}=(N_{x,n}b_x^2/6)q^2$$

$$\lambda_{x,n}=N_{x,w}/N_{x,n}$$

wherein $v_x$ is mole volume of X (cm³/mol), and $f_x$ is a volume ratio of X. $N_{x,n}$ and $N_{x,w}$ are a number average degree of polymerization and a weight average degree of polymerization of X block, respectively; and $b_x$ is a segment length of X. The $\chi$ value of the block copolymer obtained from the SAXS measurement result and the above calculation formulae refers to the $\chi$ value at 25° C., unless otherwise stated.

For a more detailed calculation method, it may refer to Leibler, L., "Theory of Microphase Separation in Block Copolymers", Macromolecules 1980, 13, pp. 1602-1617, and Hashimoto, T., et al., "Order-Disorder Transition of Low Molecular Weight Polystyrene-block-Polyisoprene. 1. SAXS Analysis of Two Characteristic Temperatures", Macromolecules 1995, 28, pp. 6825-6834. For example, for the calculation method for the PMMA-b-PS diblock copolymer, see Zhao, Y., et al., "SAXS Analysis of the Order-Disorder Transition and the Interaction Parameter of Polystyrene-block-poly(methyl methacrylate)", Macromolecules 2008, 41, pp. 9948-9951. The matters described in the above three articles are deemed to be the same as described herein.

Specifically, the block copolymer according to an exemplary embodiment of the present invention may have the $\chi$ value at 25° C. of 0.01 to 0.26, and more preferably, the $\chi$ value at 25° C. of 0.035 to 0.10. In this range, the block copolymer may effectively form the patterns having a lamella structure by a self-assembling process, and decrease LER and LWR.

The $\chi$ value as such may be adjusted depending on the molecular weight of the block copolymer and the mole fraction of the repeating unit C introduced into the second block.

Specifically, the block copolymer according to an exemplary embodiment of the present invention may satisfy the following Equation 1:

$$1,000 \leq M_n \times m \times (a/5) \leq 60,000 \quad \text{[Equation 1]}$$

wherein $M_n$ is a number average molecular weight of the block copolymer; m is a mole fraction of the repeating unit C; and a is the number of F introduced into the repeating unit C.

As such, Equation 1 may be satisfied by adjusting the number average molecular weight of the block copolymer, the mole fraction of the repeating unit C introduced into the second block and the number of F introduced into the repeating unit C, thereby having the $\chi$ value in the range of 0.035 to 0.10. Here, the number of F introduced into the repeating unit C refers to not the number of F introduced into the entire block copolymer, but the number of F introduced into the unit Chemical Formula of one repeating unit C. For Example, when the block copolymer satisfies Chemical Formula 3, a is 5, when only any one of $X_1$ to $X_5$ is substituted with F, a is 1, and when $X_1$ to $X_5$ are all substituted with $CF_3$, a is 15.

The number average molecular weight of the block copolymer according to an exemplary embodiment of the present invention may be, as a non-limiting example, 5,000 to 500,000 g/mol, preferably 10,000 to 300,000 g/mol. The polydispersity index (PDI; molecular weight distribution; Mw/Mn) of the block copolymer may be, as a non-limiting example, 1.5 or less, preferably 1.0 to 1.2. The polydispersity index refers to a value obtained by dividing a weight average molecular weight by a number average molecular weight, and may be generally measured by size exclusion chromatography (SEC or GPC), and calculated by the measurement condition known in the art.

It is preferred to satisfy the number average molecular weight and the polydispersity index, since vertically oriented lamella patterns may be obtained even on a large area substrate without defects, however, the present invention is not limited to the above numerical range.

Specifically, the block copolymer according to the present invention may have a weight ratio between the first block having the repeating unit represented by the following Chemical Formula 1 and the second block having the repeating unit represented by the following Chemical Formula 2 being 1:0.3 to 0.7, preferably 1:0.4 to 0.6.

As described above, the block copolymer according to the present invention may have excellent etching selectivity by including the first block having the repeating unit represented by the following Chemical Formula 1, and the second block having the repeating unit represented by the following Chemical Formula 2.

Specifically, the block copolymer according to an exemplary embodiment of the present invention may have the etching selectivity satisfying the following Equation 2:

$$4 \leq ER_1/ER_2 \quad \text{[Equation 2]}$$

wherein $ER_1$ is an etching rate (nm/sec) of the first block; $ER_2$ is an etching rate (nm/sec) of the second block; and each of the etching rates (nm/sec) is calculated from the following Calculation Formula 1:

$$\text{Etching rate}=(T_0-T_1)/S \quad \text{[Calculation Formula 1]}$$

wherein $T_0$ is an initial thickness (nm) of the first block or the second block before etching; $T_1$ is a final thickness (nm) of the first block or the second block after etching; and S is etching time (sec).

That is, when etching for the same time, the first block may be etched 4 or more times faster than the second block, and thus, the first block may be clearly etched while minimizing damage to the second block.

As such, the etching selectivity may be maximized by using the block copolymer including the first block having the repeating unit represented by Chemical Formula 1 and the second block having the repeating unit represented by Chemical Formula 2, and thus, high quality fine patterns having decreased line width, LER and LWR may be formed.

Meanwhile, prior to performing the aligning step of aligning a block copolymer coated on a substrate to be patterned, a step of coating the block copolymer on the substrate may be performed beforehand. That is, the method of forming fine patterns according to an exemplary embodiment of the present invention may include a coating step of coating a block copolymer on a substrate; an aligning step of aligning the coated block copolymer to be patterned; and a removing step of selectively removing any one unit block of the patterned block copolymer.

Here, any substrate may be used without particular limitation as long as it is commonly used in the art, and the substrate may be in the form of a wafer or a film, and in terms of physical properties, the substrate may be a rigid or flexible substrate. Crystallographically, the substrate may be monocrystalline, polycrystalline or amorphous, or in a mixed phase in which a crystalline phase and an amorphous phase are mixed. When the substrate is a laminated substrate in which two or more layers are laminated, each layer may be independently of each other monocrystalline, polycrystalline, amorphous or in a mixed phase. Materially, the substrate may be an inorganic substrate. As a non-limiting example, Group 4 semiconductors including silicon (Si), germanium (Ge) or silicon germanium (SiGe); Group 3-5 semiconductors including gallium arsenide (GaAs), indium phosphorus (InP) or gallium phosphorus (GaP); Group 2-6 semiconductors including cadmium sulfide (CdS) or zinc telluride (ZnTe); Group 4-6 semiconductors including lead sulfide (PbS); and a laminated substrate in which each layer formed by two or more materials selected from the oxides thereof is laminated, may be listed, and preferably, the substrate may be a Si substrate.

In addition, the substrate may be prepared differently depending on whether the method of forming fine patterns is graphoepitaxy or chemoepitaxy. Graphoepitaxy is a method which is a combination of self-assembly behavior of a block copolymer and traditional lithography, including producing micron-sized groove patterns by photolithography, and forming a block copolymer film on these groove patterns to control self-assembly of the block copolymer by utilizing topographic patterns of the groove patterns, and chemoepitaxy is a method of controlling self-assembly of a block copolymer by utilizing chemical difference of a relatively flat substrate, which is useful when lamella structure patterns are intended to be oriented in a certain direction.

For example, when forming fine patterns by graphoepitaxy, the substrate may have a photoresist layer having grooves formed on the substrate, and the method of forming grooves is not particularly limited, but the grooves may be formed by photolithography.

Specifically, the method of forming grooves may include coating photoresist on a substrate; and exposing the photoresist to light using a mask and developing the photoresist to form a photoresist layer having grooves.

Any photoresist may be used without particular limitation as long as it is commonly used in the art, and as a non-limiting specific example, any one or two or more polymer resins selected from the group consisting of Novolac polymer, polyviylphenol (PVP), acrylate, Norbornene polymer, polytetrafluoroethylene (PTFE), silsesquioxane polymer, polymethylmethacrylate (PMMA), terpolymer, poly(1-butene sulfone) (PBS), Novolac based positive electron resist (NPR), poly(methyl-α-chloroacrylate-co-α-methyl styrene) (ZEP), poly(glycidyl methacrylate-co-ethyl acrylate) (COP), and polychloromethylstyrene (PCMS) may be used. In addition, both positive photoresist and negative photoresist may be used, but the present invention is not limited thereto.

However, when the fine patterns are formed by the chemoepitaxy method, the guideline of the substrate may be previously formed in order to derive orientation of a block copolymer during spontaneous self-assembly, and the guideline derives the spontaneous self-alignment of a block copolymer, and allows fine patterns having higher density to be formed. The guideline may be formed by a self-assembled monolayer (SAM) or brush treatment, preferably a brush treatment. The brush treatment balances the interfacial tension of a hydrophobic unit block and a hydrophilic unit block, thereby allowing the lamella patterns on a substrate surface to be effectively formed in a form perpendicular to the surface. In addition, the naturally formed, molecular assembled nanostructure of the block copolymer may have an irregular arrangement and include a lot of defects, and by minimizing these defects, a desired pattern form may be oriented.

Hereinafter, the method of forming fine patterns according to an exemplary embodiment of the present invention will be described in detail.

First, as described above, prior to performing an aligning step, a coating step of coating a block copolymer on a substrate may be performed.

In the coating step, a coating method of a block copolymer may be used without particular limitation as long as it is commonly used in the art, and specifically, for example, the block copolymer may be coated on a substrate by spin coating, bar coating or dip coating, and preferably, spin coating may be used for forming a uniform and thin film.

Next, an aligning step of aligning the block copolymer coated on the substrate to be patterned may be performed. The aligning step is not particularly limited as long as it is under the condition that the block copolymer is spontaneously self-assembled, however, thermal annealing, solvent annealing or a combination thereof may be performed.

Thermal annealing is a method of heating the block copolymer above the glass transition temperature of the block copolymer to be aligned, and for example, annealing may be performed at a temperature of 150 to 300° C. for 1 minute to 24 hours. In this range, the block copolymer may effectively form vertically oriented lamella structure patterns. For forming more highly aligned lamella patterns, annealing may be performed at a temperature of 200 to 250° C. for 3 minutes to 12 hours.

Solvent annealing is a method of exposing a block copolymer film coated on the substrate to solvent vapor to impart flowability to polymer chains, and the solvent may be for example, any one or two or more selected from the group consisting of toluene, acetone, benzene, ethanol, n-butanol, n-heptanol, isopropane, hexane and cyclohexane, but not necessarily limited thereto. The solvent annealing is not particularly limited, however, for example, annealing may be performed at a temperature of 50 to 300° C. for 1 minute to 24 hours. In this range, sufficient flowability may be imparted to polymer chains to effectively align the block copolymer.

Next, a removing step of selectively removing any one unit block of the patterned block copolymer may be performed. Specifically, the removing step may be performed by wet etching, dry etching or a combination thereof, however, for forming high quality fine patterns, dry etching is preferred. That is, the removing step may be performed by dry etching, and the block to be removed by dry etching may be the first block having a high etching rate. Here, the dry etching may be performed using reactive ion etching (RIE) which is commonly used in the art.

As such, by performing dry etching, the etching selectivity of the block copolymer is further improved, thereby securing high quality fine patterns having LER of 3.5 nm or less and LWR of 4 nm or less. Here, the lower limit of LER and LWR may be the lowest numerical value as substantially possible, and specifically for example, 0.1 nm or more.

Hereinafter, the method of forming fine patterns according to the present invention will be described in more detail by the following Examples. However, the following Examples are only a reference for describing the present invention in detail, and the present invention is not limited thereto, and may be implemented in various forms.

In addition, unless otherwise defined, all technical terms and scientific terms have the same meanings as those commonly understood by a person skilled in the art to which the present invention pertains. The terms used herein are only for effectively describing a certain exemplary embodiment, and not intended to limit the present invention. Further, unless otherwise stated, the unit of added materials herein may be wt %.

Example 1

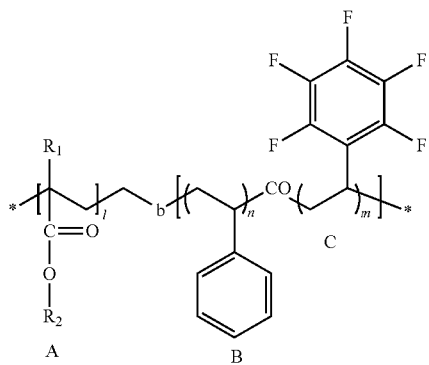

AIBN (Azobisisobutyronitrile), a RAFT reagent (cyanoisopropyl dithiobenzoate) and methyl methacrylate (MMA) were dissolved in benzene at a mole ratio of 1:5:2800 (total concentration: 50 wt %), and reacted at 80° C. for 6 hours under a nitrogen atmosphere to synthesize a macroinitiator (number average molecular weight: 45,400, molecular weight distribution: 1.2). Thereafter, the macroinitiator, AIBN, styrene (ST), and pentafluorostyrene (PFS) were dissolved in dioxane at a mole ratio of 1:0.2:900:100 (total concentration: 60 wt %), and reacted at 70° C. for 24 hours under a nitrogen atmosphere to synthesize a block copolymer consisting of a first block including polymethylmethacrylate (PMMA) and a second block including a styrene and pentafluorostyrene random copolymer (number average molecular weight: 95,200, molecular weight distribution: 1.2). The thus-produced block copolymer was analyzed using NMR to confirm the mole fraction of each repeating unit.

Examples 2-4

The macroinitiator of Example 1 was used, AIBN was 20 mol % relative to the macroinitiator, and the moles of styrene (ST) and pentafluorostyrene (PFS) were changed as described in the following Table 1, thereby synthesizing block copolymers.

Example 5

AIBN (Azobisisobutyronitrile), a RAFT reagent (cyanoisopropyl dithiobenzoate) and methyl methacrylate were dissolved in benzene at a mole ratio of 1:5:1500 (total concentration: 50 wt %), and reacted at 80° C. for 6 hours under a nitrogen atmosphere to synthesize a macroinitiator (number average molecular weight: 21,500, molecular weight distribution: 1.2). Thereafter, the macroinitiator, AIBN, styrene (ST), and pentafluorostyrene (PFS) were dissolved in dioxane at a mole ratio of 1:0.2:450:50 (total concentration: 60 wt %), and reacted at 70° C. for 24 hours under a nitrogen atmosphere to synthesize a block copolymer (number average molecular weight: 42.2, molecular weight distribution: 1.21). The thus-produced block copolymer was analyzed using NMR to confirm the mole fraction of each repeating unit.

Examples 6-8

The macroinitiator of Example 2 was used, and the moles of styrene (ST) and pentafluorostyrene (PFS) were changed as described in the following Table 1, thereby synthesizing block copolymers.

Example 9

All processes proceeded in the same manner as in Example 6 except for using tert-butyl acrylate instead of methyl methacrylate.

Example 10

The process proceeded in the same manner as in Example 1, except that the mole of each monomer was changed as described in the following Table 1, thereby synthesizing a block copolymer.

Example 11

The process proceeded in the same manner as in Example 5, except that the mole of each monomer was changed as described in the following Table 1, thereby synthesizing a block copolymer.

Example 12

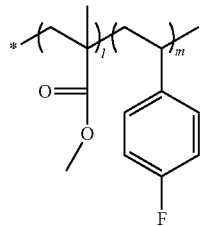

AIBN (Azobisisobutyronitrile), a RAFT reagent (cyanoisopropyl dithiobenzoate) and methyl methacrylate were dissolved in benzene at a mole ratio of 1:5:1500 (total concentration: 50 wt %), and reacted at 80° C. for 6 hours under a nitrogen atmosphere to synthesize a macroinitiator (number average molecular weight: 20,900, molecular weight distribution: 1.11). Thereafter, the macroinitiator, AIBN and 4-fluorostyrene were dissolved in dioxane at a mole ratio of 1:0.2:700 (total concentration: 60 wt %), and reacted at 70° C. for 24 hours under a nitrogen atmosphere to synthesize a block copolymer (number average molecular weight: 42,100, molecular weight distribution: 1.19). The thus-produced block copolymer was analyzed using NMR to confirm the mole fraction of each repeating unit.

Comparative Example 1

The process proceeded in the same manner as in Example 1, except that the mole of each monomer was changed as described in the following Table 1, thereby synthesizing a block copolymer.

Comparative Example 2

The process proceeded in the same manner as in Example 5, except that the mole of each monomer was changed as described in the following Table 1, thereby synthesizing a block copolymer.

Comparative Example 3

All processes proceeded in the same manner as in Example 1 except for using phenyl methacrylate instead of methyl methacrylate.

Comparative Example 4

All processes proceeded in the same manner as in Example 5 except for using phenyl methacrylate instead of methyl methacrylate.

Experimental Example 1

Block copolymers synthesized in Examples 1 to 12, and Comparative Examples 1 to 4 were dissolved in a solvent at a concentration of about 1.0 wt %, and then spin-coated on a silicon wafer at a speed of 4000 rpm for 30 seconds.

Thereafter, thermal annealing was performed at 225° C. for 12 hours to perform self-assembly.

Then, RIE (reactive-ion etching) was performed in order to remove a PMMA block in a block copolymer film. Here, the power of reactive plasma (RF) was 60 W, etching was performed under the conditions of a reactive plasma injection speed of 45 sccm, a pressure of 30 mTorr and a bias voltage of 170 V to remove a first block, the micrographs of the polymer film were taken by SEM (scanning electron microscope) or AFM (Atomic force microscopy), and CD, LER and LWR of the self-assembled patterns were measured using SuMMIT Software. In addition, etching selectivity was calculated according to the following Equation 2, and is shown in Table 3.

$$ER_1/ER_2 \quad \text{[Equation 2]}$$

wherein $ER_1$ is an etching rate (nm/sec) of the first block; and $ER_2$ is an etching rate (nm/sec) of the second block.

$$\text{Etching rate} = (T_0 - T_1)/S \quad \text{[Calculation Formula 1]}$$

wherein $T_0$ is an initial thickness (nm) of the first block or the second block before etching; $T_1$ is a final thickness (nm) of the first block or the second block after etching; and S is etching time (sec).

TABLE 1

| | l:n:m (mole fraction) | $M_n$ (g/mol) | $M_n \times m \times (a/5)$ |
|---|---|---|---|
| Example 1 | 0.5:0.45:0.05 | 95,200 | 4,760 |
| Example 2 | 0.5:0.35:0.15 | 108,400 | 16,260 |
| Example 3 | 0.5:0.25:0.25 | 110,650 | 27,663 |
| Example 4 | 0.5:0.15:0.35 | 109,700 | 38,395 |
| Example 5 | 0.5:0.45:0.05 | 42,200 | 2,110 |
| Example 6 | 0.5:0.35:0.15 | 41,600 | 6,240 |
| Example 7 | 0.5:0.25:0.25 | 41,900 | 10,475 |
| Example 8 | 0.5:0.15:0.35 | 42,700 | 14,945 |
| Example 9 | 0.5:0.35:0.15 | 43,000 | 6,450 |
| Example 10 | 0.5:0:0.5 | 111,480 | 55,740 |
| Example 11 | 0.5:0:0.5 | 43,000 | 21,500 |
| Example 12 | 0.5:0:0.5 | 42,100 | 4,210 |
| Comparative Example 1 | 0.5:0.5:0 | 107,200 | 0 |
| Comparative Example 2 | 0.5:0.5:0 | 42,100 | 0 |
| Comparative Example 3 | 0.5:0.45:0.05 | 122,400 | 5,580 |
| Comparative Example 4 | 0.5:0.45:0.05 | 55,100 | 2,755 |

TABLE 2

| | $F_{PFS}$ | PDI | X value |
|---|---|---|---|
| Example 1 | 6% | 1.25 | 0.0324 |
| Example 2 | 16% | 1.25 | 0.0580 |
| Example 3 | 27% | 1.25 | 0.0615 |
| Example 4 | 38% | 1.25 | 0.105 |
| Example 5 | 5% | 1.20 | 0.0306 |
| Example 6 | 16% | 1.19 | 0.0570 |
| Example 7 | 26% | 1.18 | 0.0610 |
| Example 8 | 37% | 1.21 | 0.11 |
| Example 9 | 15% | 1.20 | 0.0524 |
| Example 10 | 50% | 1.26 | 0.12 |
| Example 11 | 50% | 1.24 | 0.12 |
| Example 12 | — | 1.19 | 0.0916 |
| Comparative Example 1 | — | 1.23 | 0.0275 |
| Comparative Example 2 | — | 1.18 | 0.0306 |
| Comparative Example 3 | 5% | 1.25 | 0.0291 |
| Comparative Example 4 | 4% | 1.20 | 0.0277 |

In the above Table 2, $F_{PFS}$ refers to the mole fraction of the repeating unit of pentafluorostyrene group (PFS) included in the above Chemical Formula 2, specifically PFS moles/(ST moles+PFS moles).

As shown in Table 1, the repeating unit C to which an F group is introduced according to the present invention is introduced, and the mole fraction of each repeating unit was adjusted, thereby preparing block copolymers.

As a result, in Examples 1 to 12, it was confirmed that patterns having a lamella structure were formed.

Figure 2:
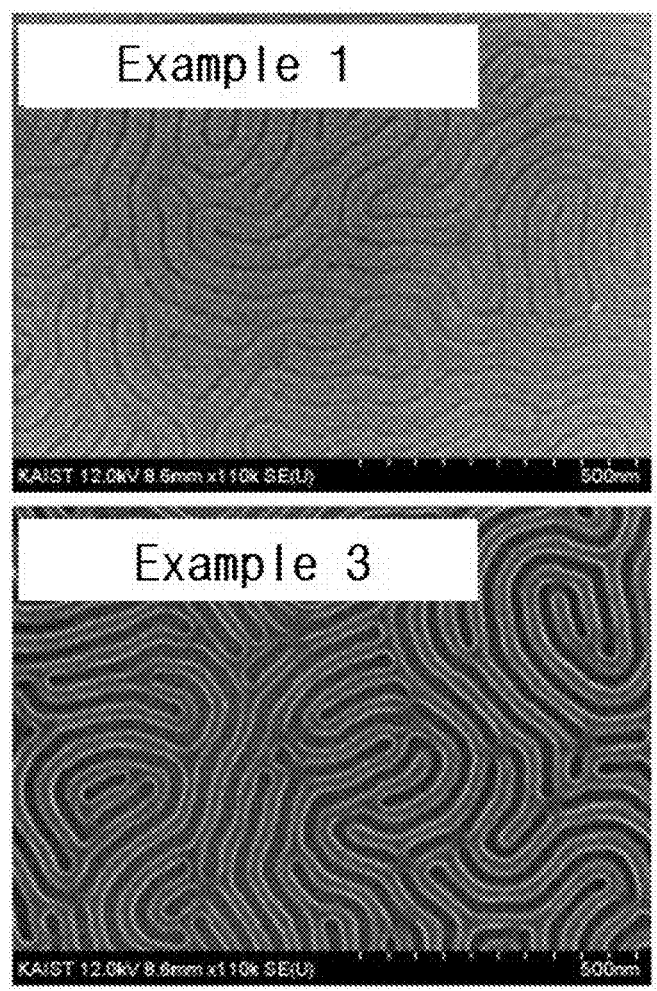
FIG. 2 represents etched nanopatterns according to Examples 1 and 3, showing the effect from adjusting the mol % of repeating unit C.
Figure 3:
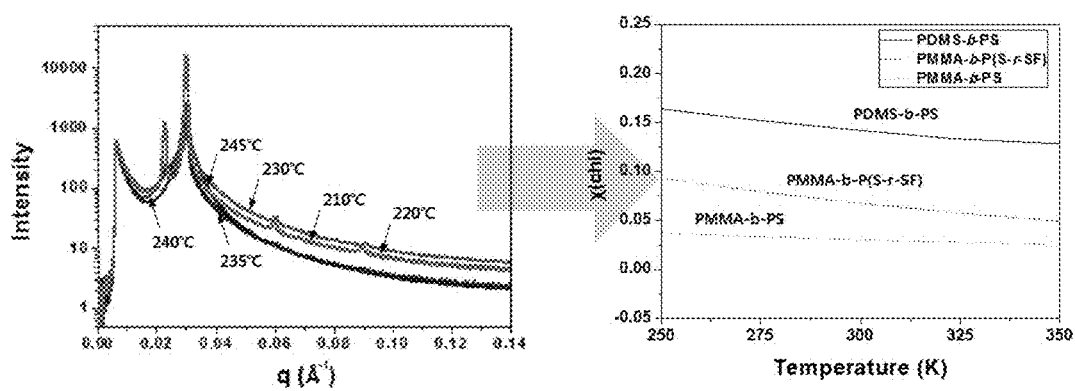
FIG. 3 is SAXS of the block copolymers according to Example and Comparative Example 1 (left), and a temperature-$\chi$ graph calculated therefrom.

Among them, as shown in FIG. 2, it was confirmed that Examples 2, 3, 6, 7 and 9 containing a pentafluorostyrene group as the repeating unit C, and satisfying the mole fraction of the repeating unit C being 0.1-0.3 satisfy the range of χ value being 0.035-1, thereby very effectively forming lamella patterns, and when forming fine patterns by etching these, as shown in the following Table 3, it was confirmed that very high quality fine patterns were formed.

Meanwhile, Examples 1, 4, 5 and 8 contained a pentafluorostyrene group as the repeating unit C, but had the mole fraction of the repeating unit C being rather out of the range of 0.1-0.3, and thus, it was confirmed that the lamella structure patterns were effectively formed, however, as shown in the following Table 3, the quality of fine patterns after etching was rather deteriorated.

In addition, Examples 10 and 11 had the mole fraction of the repeating unit C being significantly out of the range of 0.1-0.3, and thus, the lamella structure patterns were rather unstably formed.

Though Example 12 had the mole fraction of the repeating unit C being significantly out of 0.3, the number of F introduced into a styrene group was 1, and thus, it was confirmed that the number of F contained in the entire block copolymer was appropriately adjusted, thereby forming the lamella structure patterns.

However, in Comparative Example 1, the lamella structure patterns were formed, and as described below in etching property evaluation and Table 3, it was confirmed that the etching selectivity dropped as compared with Examples, thereby deteriorating the properties of pitch, CD, LWR and LER.

In Comparative Example 3, the lamella patterns were rather unstably formed, and as described below in etching property evaluation and Table 3, it was confirmed that the etching selectivity dropped as compared with Examples, thereby deteriorating the properties of pitch, CD, LWR and LER.

TABLE 3

|  | Etching selectivity between blocks | Pitch (nm) | CD (nm) | LWR (nm) | LER (nm) |
| --- | --- | --- | --- | --- | --- |
| Example 1 | 4.6 | 46.7 ± 0.26 | 25.9 ± 0.23 | 4.23 ± 0.25 | 3.38 ± 0.20 |
| Example 3 | 5.1 | 55.8 ± 0.15 | 22.1 ± 0.21 | 3.88 ± 0.31 | 3.14 ± 0.12 |
| Example 5 | 4.6 | 42.1 ± 0.22 | 26.2 ± 0.23 | 4.78 ± 0.19 | 3.26 ± 0.19 |
| Example 7 | 5.2 | 28.3 ± 0.17 | 19.2 ± 0.24 | 3.07 ± 0.13 | 3.01 ± 0.24 |
| Example 12 | 5.2 | 31.3 ± 0.11 | 21.0 ± 0.13 | 3.37 ± 0.20 | 3.04 ± 0.09 |
| Comparative Example 1 | 3.7 | 49.5 ± 0.39 | 29.1 ± 0.28 | 5.68 ± 0.23 | 3.74 ± 0.19 |
| Comparative Example 3 | 3.5 | 51.5 ± 0.22 | 30.2 ± 0.15 | 5.90 ± 0.19 | 3.82 ± 0.25 |

As seen from Table 3, the unit block C into which fluorine was introduced had increased etching resistance to significantly improve etching selectivity, and thus, high quality fine patterns was able to be prepared after etching.

In particular, in Examples 3, 7 and 12, it is recognized that the etching selectivity between blocks was 5 or more, which is much superior to that of Comparative Example 1, and especially in Example 7, the line width, LWR and LER were small, i.e., about 75%, about 68% and about 81%, respectively, relative to those of Comparative Example 1, and thus, it was confirmed that high quality patterns were formed.

According to the present invention, the block copolymer including the first block and the second block may have a very good vertical orientation property to form vertically oriented lamella patterns by a self-assembly process in a very short time, and to form almost perfectly aligned nanopatterns even on a large area substrate. In addition, the etching selectivity between two blocks is excellent, thereby greatly decreasing LER and LWR in development.

Hereinabove, although the present invention has been described by specific matters and limited Examples, they have been provided only for assisting in the entire understanding of the present invention. Therefore, the present invention is not limited to the above Examples. Various modifications and changes may be made by those skilled in the art to which the present invention pertains from this description.

Therefore, the spirit of the present invention should not be limited to the above-described exemplary embodiments, and the following claims as well as all modified equally or equivalently to the claims are intended to fall within the scope and spirit of the invention.

What is claimed is:
1. A method of forming fine patterns comprising:
   aligning a block copolymer coated on a substrate to be patterned; and selectively removing any one unit block of the patterned block copolymer,
   wherein the block copolymer includes a first block having a repeating unit represented by the following Chemical Formula 1, and a second block having a repeating unit represented by the following Chemical Formula 3:

[Chemical Formula 1]

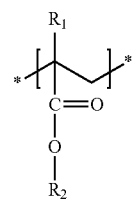

A

[Chemical Formula 3]

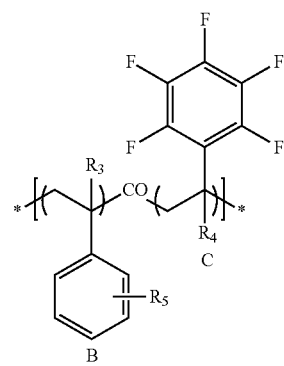

C wherein
$R_1$ to $R_4$ are independently selected from the group consisting of —H, an alkyl group having 1 to 10 carbon atoms, an alkenyl group having 2 to 10 carbon atoms, an alkynyl group having 2 to 10 carbon atoms, a halogen group, a cyano group, an alkoxy group having 1 to 10 carbon atoms, an alkylthio group having 1 to 10 carbon atoms, an alkylcarbonyl group having 1 to 10 carbon atoms, and an alkenylcarbonyl group having 2 to 10 carbon atoms;
$R_5$ is selected from the group consisting of —H, an alkyl group having 1 to 10 carbon atoms, a cycloalkyl group having 3 to 10 carbon atoms, an alkenyl group having 2 to 10 carbon atoms, a cycloalkenyl group having 3 to 10 carbon atoms, an alkynyl group having 2 to 10 carbon atoms, a heterocycloalkyl group having 2 to 10 carbon atoms containing any one or two or more heteroatoms selected from O, N and S, an aryl group having 6 to 20 carbon atoms, a heteroaryl group having 4 to 20 carbon atoms containing any one or two or more heteroatoms selected from O, N and S, a halogen group, a cyano group, an alkoxy group having 1 to 10 carbon atoms, a cycloalkoxy group having 3 to 10 carbon atoms, an aryloxy group having 6 to 20 carbon atoms, an alkylthio group having 1 to 10 carbon atoms, a cycloalkylthio group having 3 to 10 carbon atoms, an arylthio group having 6 to 20 carbon atoms, an alkylcarbonyl group having 1 to 10 carbon atoms, an alkenylcarbonyl group having 2 to 10 carbon atoms, an arylcarbonyl group having 6 to 20 carbon atoms, a cycloalkylcarbonyl group having 3 to 10 carbon atoms, and a cycloalkenylcarbonyl group having 3 to 10 carbon atoms; and in the block copolymer, when mole fractions of repeating units A, B and C in the block copolymer represented by the above Chemical Formulae 1 and 3 are l, n and m, respectively, l is 0.2 to 0.9, n is 0 to 0.6, m is 0.01 to 0.7, and l+n+m=1.

2. The method of claim 1, wherein the first block is formed from an alkylmethacrylate-based compound.

3. The method of claim 1, wherein the block copolymer forms vertically oriented lamella patterns.

4. The method of claim 1, wherein the aligning is performed by thermal annealing, solvent annealing or a combination thereof.

5. The method of claim 1, wherein the removing is performed by dry etching.

6. A method of forming fine patterns comprising: aligning a block copolymer coated on a substrate to be patterned; and selectively removing any one unit block of the patterned block copolymer, wherein the block copolymer includes a first block having a repeating unit represented by the following Chemical Formula 1, and a second block having a repeating unit represented by the following Chemical Formula 2:

[Chemical Formula 1]

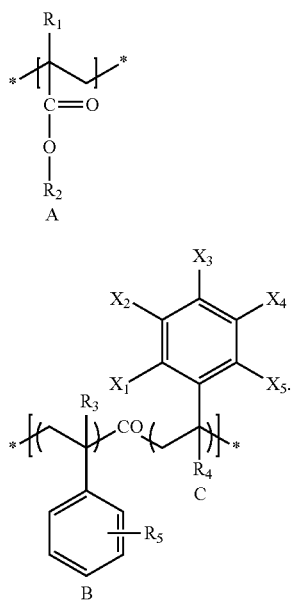

[Chemical Formula 2]

wherein
$R_1$ to $R_4$ are independently selected from the group consisting of —H, an alkyl group having 1 to 10 carbon atoms, an alkenyl group having 2 to 10 carbon atoms, an alkynyl group having 2 to 10 carbon atoms, a halogen group, a cyano group, an alkoxy group having 1 to 10 carbon atoms, an alkylthio group having 1 to 10 carbon atoms, an alkylcarbonyl group having 1 to 10 carbon atoms, and an alkenylcarbonyl group having 2 to 10 carbon atoms;

$R_5$ is selected from the group consisting of —H, an alkyl group having 1 to 10 carbon atoms, a cycloalkyl group having 3 to 10 carbon atoms, an alkenyl group having 2 to 10 carbon atoms, a cycloalkenyl group having 3 to 10 carbon atoms, an alkynyl group having 2 to 10 carbon atoms, a heterocycloalkyl group having 2 to 10 carbon atoms containing any one or two or more heteroatoms selected from O, N and S, an aryl group having 6 to 20 carbon atoms, a heteroaryl group having 4 to 20 carbon atoms containing any one or two or more heteroatoms selected from O, N and S, a halogen group, a cyano group, an alkoxy group having 1 to 10 carbon atoms, a cycloalkoxy group having 3 to 10 carbon atoms, an aryloxy group having 6 to 20 carbon atoms, an alkylthio group having 1 to 10 carbon atoms, a cycloalkylthio group having 3 to 10 carbon atoms, an arylthio group having 6 to 20 carbon atoms, an alkylcarbonyl group having 1 to 10 carbon atoms, an alkenylcarbonyl group having 2 to 10 carbon atoms, an arylcarbonyl group having 6 to 20 carbon atoms, a cycloalkylcarbonyl group having 3 to 10 carbon atoms, and a cycloalkenylcarbonyl group having 3 to 10 carbon atoms;

$X_1$ to $X_5$ are independently selected from the group consisting of —H, —F, an alkyl group having 1 to 10 carbon atoms substituted with at least one F, a cycloalkyl group having 3 to 10 carbon atoms substituted with at least one F, and an aryl group having 6 to 20 carbon atoms substituted with at least one F, with a proviso that all of them are not —H;

in the block copolymer, when mole fractions of repeating units A, B and C in the block copolymer represented by the above Chemical Formula 1 and 2 are l, n and m, respectively, l is 0.2 to 0.9, n is 0 to 0.6, m is 0.01 to 0.7, and l+n+m=1; and the block copolymer has a x value at 25° C. of 0.01 to 0.26.

7. A method of forming fine patterns comprising: aligning a block copolymer coated on a substrate to be patterned; and selectively removing any one unit block of the patterned block copolymer, wherein the block copolymer includes a first block having a repeating unit represented by the following Chemical Formula 1, and a second block having a repeating unit represented by the following Chemical Formula 2:

[Chemical Formula 1]

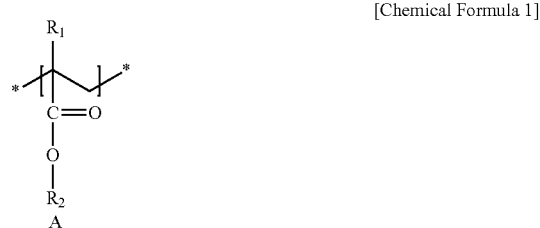

-continued

[Chemical Formula 2]

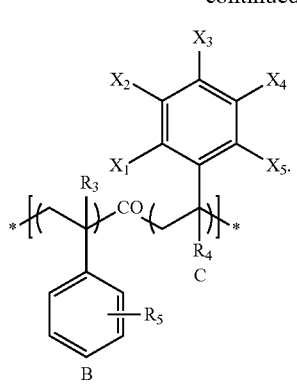

wherein
$R_1$ to $R_4$ are independently selected from the group consisting of —H, an alkyl group having 1 to 10 carbon atoms, an alkenyl group having 2 to 10 carbon atoms, an alkynyl group having 2 to 10 carbon atoms, a halogen group, a cyano group, an alkoxy group having 1 to 10 carbon atoms, an alkylthio group having 1 to 10 carbon atoms, an alkylcarbonyl group having 1 to 10 carbon atoms, and an alkenylcarbonyl group having 2 to 10 carbon atoms;
$R_5$ is selected from the group consisting of —H, an alkyl group having 1 to 10 carbon atoms, a cycloalkyl group having 3 to 10 carbon atoms, an alkenyl group having 2 to 10 carbon atoms, a cycloalkenyl group having 3 to 10 carbon atoms, an alkynyl group having 2 to 10 carbon atoms, a heterocycloalkyl group having 2 to 10 carbon atoms containing any one or two or more heteroatoms selected from O, N and S, an aryl group having 6 to 20 carbon atoms, a heteroaryl group having 4 to 20 carbon atoms containing any one or two or more heteroatoms selected from O, N and S, a halogen group, a cyano group, an alkoxy group having 1 to 10 carbon atoms, a cycloalkoxy group having 3 to 10 carbon atoms, an aryloxy group having 6 to 20 carbon atoms, an alkylthio group having 1 to 10 carbon atoms, a cycloalkylthio group having 3 to 10 carbon atoms, an arylthio group having 6 to 20 carbon atoms, an alkylcarbonyl group having 1 to 10 carbon atoms, an alkenylcarbonyl group having 2 to 10 carbon atoms, an arylcarbonyl group having 6 to 20 carbon atoms, a cycloalkylcarbonyl group having 3 to 10 carbon atoms, and a cycloalkenylcarbonyl group having 3 to 10 carbon atoms;
$X_1$ to $X_5$ are independently selected from the group consisting of —H, —F, an alkyl group having 1 to 10 carbon atoms substituted with at least one F, a cycloalkyl group having 3 to 10 carbon atoms substituted with at least one F, and an aryl group having 6 to 20 carbon atoms substituted with at least one F, with a proviso that all of them are not —H;
in the block copolymer, when mole fractions of repeating units A, B and C in the block copolymer represented by the above Chemical Formula 1 and 2 are l, n and m, respectively, l is 0.2 to 0.9, n is 0 to 0.6, m is 0.01 to 0.7, and l+n+m=1; and
the block copolymer satisfies the following Equation 1:

$$1{,}000 \leq M_n \times m \times (a/5) \leq 60{,}000 \quad \text{[Equation 1]}$$

wherein $M_n$ is a number average molecular weight of the block copolymer; m is a mole fraction of the repeating unit C; and a is the number of F introduced into the repeating unit C.

8. A method of forming fine patterns comprising: aligning a block copolymer coated on a substrate to be patterned; and selectively removing any one unit block of the patterned block copolymer,
wherein the block copolymer includes a first block having a repeating unit represented by the following Chemical Formula 1, and a second block having a repeating unit represented by the following Chemical Formula 2:

[Chemical Formula 1]

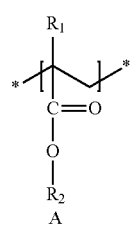

[Chemical Formula 2]

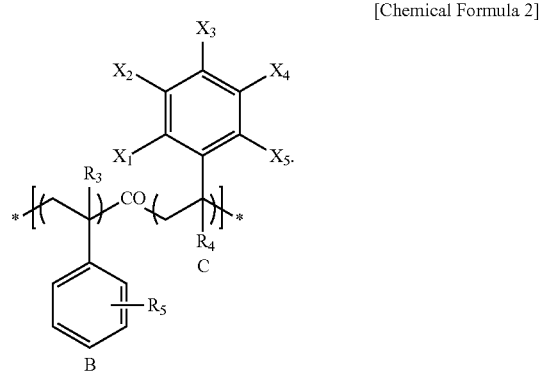

wherein
$R_1$ to $R_4$ are independently selected from the group consisting of —H, an alkyl group having 1 to 10 carbon atoms, an alkenyl group having 2 to 10 carbon atoms, an alkynyl group having 2 to 10 carbon atoms, a halogen group, a cyano group, an alkoxy group having 1 to 10 carbon atoms, an alkylthio group having 1 to 10 carbon atoms, an alkylcarbonyl group having 1 to 10 carbon atoms, and an alkenylcarbonyl group having 2 to 10 carbon atoms;
$R_5$ is selected from the group consisting of —H, an alkyl group having 1 to 10 carbon atoms, a cycloalkyl group having 3 to 10 carbon atoms, an alkenyl group having 2 to 10 carbon atoms, a cycloalkenyl group having 3 to 10 carbon atoms, an alkynyl group having 2 to 10 carbon atoms, a heterocycloalkyl group having 2 to 10 carbon atoms containing any one or two or more heteroatoms selected from O, N and S, an aryl group having 6 to 20 carbon atoms, a heteroaryl group having 4 to 20 carbon atoms containing any one or two or more heteroatoms selected from O, N and S, a halogen group, a cyano group, an alkoxy group having 1 to 10 carbon atoms, a cycloalkoxy group having 3 to 10 carbon atoms, an aryloxy group having 6 to 20 carbon atoms, an alkylthio group having 1 to 10 carbon atoms, a cycloalkylthio group having 3 to 10 carbon atoms, an arylthio group having 6 to 20 carbon atoms, an alkylcarbonyl group having 1 to 10 carbon atoms, an alkenylcarbonyl group having 2 to 10 carbon atoms, an arylcarbonyl group having 6 to 20 carbon atoms, a cycloalkylcarbonyl group having 3 to 10 carbon atoms, and a cycloalkenylcarbonyl group having 3 to 10 carbon atoms;

$X_1$ to $X_5$ are independently selected from the group consisting of —H, —F, an alkyl group having 1 to 10 carbon atoms substituted with at least one F, a cycloalkyl group having 3 to 10 carbon atoms substituted with at least one F, and an aryl group having 6 to 20 carbon atoms substituted with at least one F, with a proviso that all of them are not —H;

in the block copolymer, when mole fractions of repeating units A, B and C in the block copolymer represented by the above Chemical Formula 1 and 2 are l, n and m, respectively, l is 0.2 to 0.9, n is 0 to 0.6, m is 0.01 to 0.7, and l+n+m=1; and the block copolymer has etching selectivity satisfying the following Equation 2:

$$4 \leq ER_1/ER_2 \qquad \text{[Equation 2]}$$

wherein $ER_1$ is an etching rate (nm/sec) of the first block; $ER_2$ is an etching rate (nm/sec) of the second block; and each of the etching rates (nm/sec) is calculated from the following Calculation Formula 1:

$$\text{Etching rate} = (T_0 - T_1)/S \qquad \text{[Calculation Formula 1]}$$

wherein $T_0$ is an initial thickness (nm) of the first block or the second block before etching; $T_1$ is a final thickness (nm) of the first block or the second block after etching; and S is etching time (sec).

\* \* \* \* \*

UNITED STATES PATENT AND TRADEMARK OFFICE
CERTIFICATE OF CORRECTION

PATENT NO. : 10,047,182 B2
APPLICATION NO. : 15/712698
DATED : August 14, 2018
INVENTOR(S) : Jin Su Ham et al.

It is certified that error appears in the above-identified patent and that said Letters Patent is hereby corrected as shown below:

In the Claims

Column 19, Line 19, Claim 1, delete "1 is" and insert -- l is --

Column 20, Line 43, Claim 6, delete "1 is" and insert -- l is --

Column 21, Line 63, Claim 7, delete "1 is" and insert -- l is --

Column 23, Line 16, Claim 8, delete "1 is" and insert -- l is --

Signed and Sealed this
Twentieth Day of November, 2018

Andrei Iancu
*Director of the United States Patent and Trademark Office*